(12) United States Patent
Sakaitani

(10) Patent No.: US 7,296,195 B2
(45) Date of Patent: Nov. 13, 2007

(54) BIT SYNCHRONIZATION FOR HIGH-SPEED SERIAL DEVICE TESTING

(75) Inventor: Kris Sakaitani, San Jose, CA (US)

(73) Assignee: Credence Systems Corporation, Milpitas, CA (US)

( * ) Notice: Subject to any disclaimer, the term of this patent is extended or adjusted under 35 U.S.C. 154(b) by 120 days.

(21) Appl. No.: 11/120,368

(22) Filed: May 2, 2005

(65) Prior Publication Data

US 2006/0245291 A1 Nov. 2, 2006

(51) Int. Cl.
*G06K 5/04* (2006.01)
(52) U.S. Cl. .................. 714/700; 714/724; 714/742; 324/73.1; 326/16
(58) Field of Classification Search .......... 714/700, 714/724, 742; 324/73.1; 326/16
See application file for complete search history.

(56) References Cited

U.S. PATENT DOCUMENTS 6,058,057 A * 5/2000 Ochiai et al. ............... 365/201
6,128,754 A * 10/2000 Graeve et al. ................ 714/39
6,892,338 B2 * 5/2005 Kawai ......................... 714/740
6,990,423 B2 * 1/2006 Brown et al. ............... 702/117
7,078,889 B2 * 7/2006 Oshima .................... 324/158.1

* cited by examiner

*Primary Examiner*—Guy Lamarre
*Assistant Examiner*—Esaw T. Abraham

(57) ABSTRACT

An apparatus for testing electronic devices employs a programmable device to adjust the timing of the strobes such that the strobes sample the bit stream from a device under test at or near the center of the bit position. The strobe time adjustment is performed based on pairs of strobe readings made around a number of different bit positions. The programmable device examines the pairs of strobe reading made around each of the different bit positions to determine whether or not a bit transition has occurred there. The programmable device selects the bit positions around which a bit transition has not occurred as eye candidates, and defines the center of the largest contiguous region of eye candidates as the center of the bit position.

19 Claims, 6 Drawing Sheets

BIT SYNCHRONIZATION FOR HIGH-SPEED SERIAL DEVICE TESTING

BACKGROUND OF THE INVENTION

1. Field of the Invention

The present invention relates generally to electronic device testing, and more particularly, to bit synchronization techniques used in testing integrated circuit (IC) devices that output high-speed serial data streams.

2. Description of the Related Art

Next generation ICs will use a large number of high-speed serial links to communicate with external memory and I/O devices. In order to obtain accurate test results of such devices, it is important that a continuous stream of bits (0's and 1's) outputted by them is consistently strobed near the center of the bit and away from the transitions between the bits. If the strobes are positioned near the bit transitions, inaccurate strobe readings (e.g., 0 strobed as a 1, or 1 strobed as a 0) might result and cause inaccurate test results.

A conventional automated test equipment (ATE) uses a binary search method to locate the center of the bit. The binary search method is carried out during the initialization phase of testing when the device under test is outputting a bit stream of alternating 0's and 1's. With this method, two strobe points separated by one bit interval are initially selected. Then, a third strobe point that is halfway between the initial two strobe points is selected. The reading from the third strobe point is compared with the readings from the first two, and the pair that exhibits a transition (0 to 1 or 1 to 0) is selected as end points of a fourth strobe point that is halfway between the pair. The reading from the fourth strobe point is compared with the readings from the end points, and the pair that exhibits a transition (0 to 1 or 1 to 0) is selected as end points of a fifth strobe point that is halfway between the pair. This process is repeated until the bit transition is identified with a predetermined degree of accuracy. The bit strobe position is then computed as the position of the bit transition plus one-half of the bit interval.

The binary search method as described above is too slow and cannot be used while a test is ongoing. As a result, it is unable to correct for bit misalignments that may result during testing, e.g., during clock starts and stops, and from drifts caused by heating up or cooling down of the device.

U.S. patent application Ser. No. 10/948,709, filed Sep. 23, 2004, entitled "Bit Synchronization for High-Speed Serial Device Testing," discloses another method to locate the center of a bit. In this method, a number of different time sets that define different strobe positions along a bit interval are used. The strobe readings generated with the different time sets are evaluated and one of the time sets is selected as the one to be used during testing.

While the method described in U.S. patent application Ser. No. 10/948,709 is faster than the binary search method and permits strobe position adjustments during testing, it requires multiple time sets to be stored in memory during the entire test. This is not desirable, because memory space is not efficiently utilized, especially during the test when memory resources can be scarce.

SUMMARY OF THE INVENTION

The present invention provides a bit synchronization method used in testing electronic devices, referred to as an eye centering method, that is faster than the binary search method and does not require the use of time sets. Another advantage of the bit synchronization method according to the present invention is that it does not require matching of the bit stream to a predetermined expect data pattern. This is important, because the bit stream produced by the device under test, especially high-speed serial devices, can be very non-deterministic during initialization, and discerning the difference between an out-of-position strobe data and properly strobed data becomes very difficult.

According to an embodiment of the present invention, the timing of the strobes is adjusted such that the strobes sample the bit stream from a device under test at or near the center of the bit position. The strobe time adjustment is performed based on pairs of strobe readings made around a number of different reference bit positions. A reference bit position is deemed to be associated with a bit transition if the pair of strobe readings made around that reference bit position is not the same. The reference bit positions that are not associated with a bit transition are identified as eye candidates, and the center of the largest contiguous region of eye candidates is determined to be the center of the bit position.

The different reference bit positions span one bit interval and have equal spacing between them. Each pair of strobe readings includes a first strobe reading made at a bit position that is slightly earlier than the reference bit position and a second strobe reading made at a bit position that is slightly later than the reference bit position. The two strobe positions define a sampling window that is specified by the user. According to an embodiment of the invention, the size of the sampling window is two time steps, but this parameter may be adjusted by the user. Multiple pairs of strobe readings are made around each different reference bit position in this manner until a predetermined number of samples have been collected for each different reference bit position.

The present invention also provides a test apparatus having a device that is programmed to: (i) generate a number of different reference times to be used in strobing the bits, (ii) collect multiple pairs of strobe readings for each of the different reference times, and (iii) select one of the different reference times as the reference time to be used in subsequent strobing. The selection is made from a set of contiguous reference time candidates, wherein a reference time is identified as a reference time candidate if each of the pairs of strobe readings for that reference time outputs the same strobe reading.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
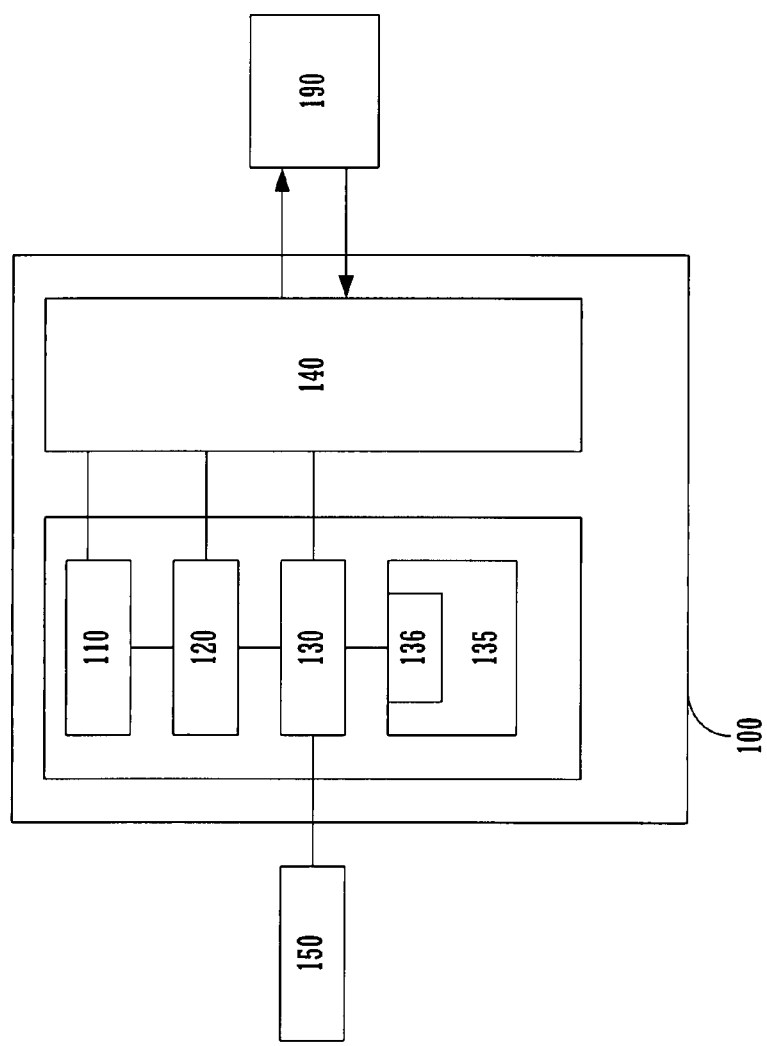
FIG. 1 shows a block diagram of a tester in which an eye centering method according to an embodiment of the invention may be carried out.

FIG. 1 shows a block diagram of a tester 100 in which an eye centering method according to an embodiment of the invention may be carried out. The tester 100 includes a number of slots in which a number of instruments are inserted. The instruments may include a device power supply (DPS) 110 for supplying power to a device under test (DUT) 190, analog test instruments 120 for supplying test signals to input analog pins of the DUT 190 and receiving response signals from output analog pins of the DUT 190, digital test instruments 130 for supplying test signals to input digital pins of the DUT 190 and receiving response signals from output digital pins of the DUT 190, a test head interface 135 which houses a master clock 136, and a fixture 140, known in the art as a loadboard, for providing a connection interface between the instruments 110, 120, 130 and the DUT 190. During testing, the tester 100 operates under the control of software, e.g., a test program 150. The bus architecture of the tester 100 by which the instruments 110, 120, 130, 135 communicate with each other, and other details of the tester 100, are described in U.S. patent application Ser. No. 10/222,191, entitled "Circuit Testing with Ring-Connected Test Instrument Modules," filed Aug. 16, 2002, which is incorporated by reference herein.

Figure 2:
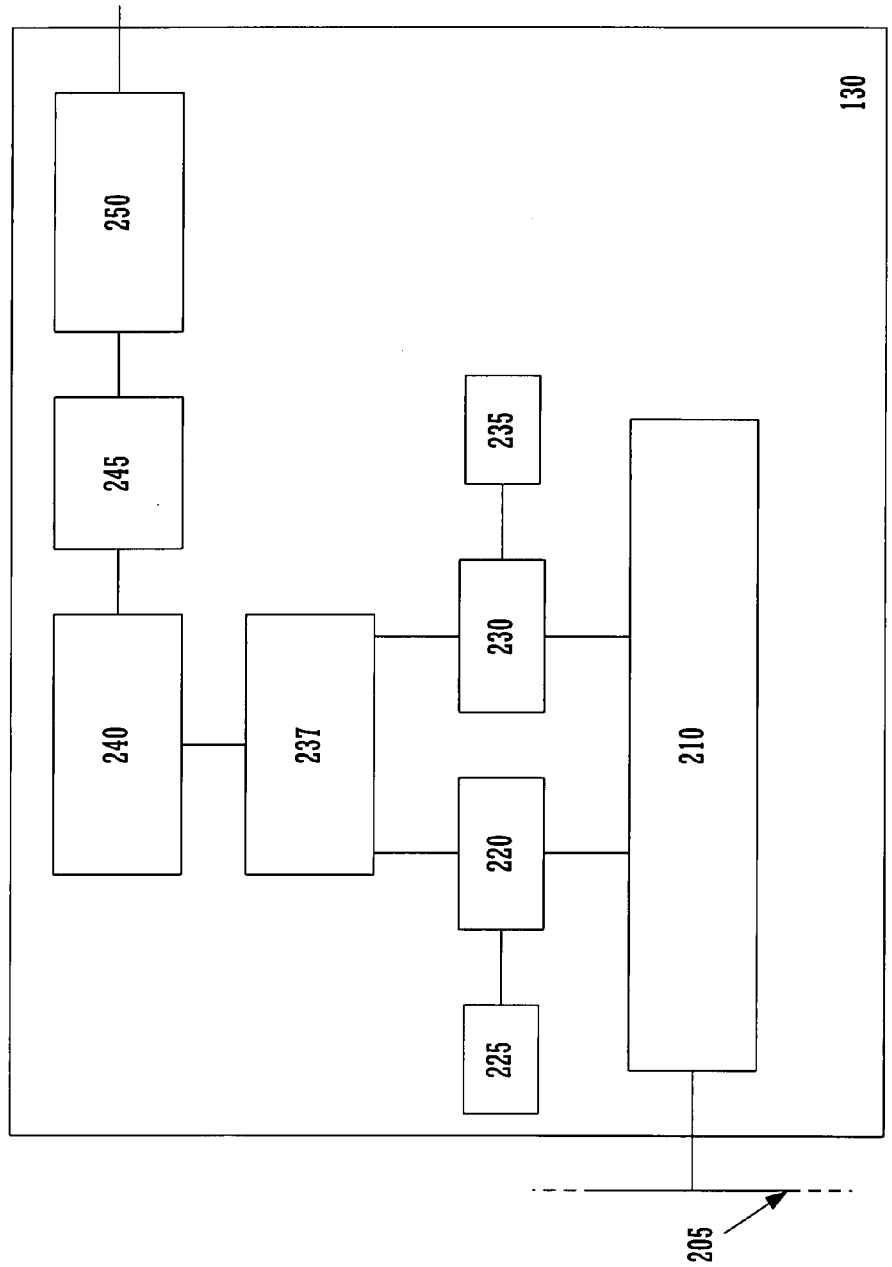
FIG. 2 is a block diagram showing an instrument used in the tester of FIG. 1 in more detail.

FIG. 2 is a block diagram showing a digital instrument 130 used in the tester 100 of FIG. 1 in more detail. In the preferred embodiment, the digital instrument 130 includes a bus interface field programmable gate array (FPGA) 210, a sequencer FPGA 220, its associated dual inline memory module (DIMM) 225, a pattern memory FPGA 230, its associated DIMM 235, multiple pin electronics FPGAs (PEFPGAs) 237 (only one of which is illustrated), multiple timing generation circuits 240 (only one of which is illustrated), multiple state tester circuits 245 (only one of which is illustrated), and multiple pin electronics circuits 250 (only one of which is illustrated). The PEFPGAs 237 are connected to the sequencer FPGA 220 and the pattern memory FPGA 230 through two sets of data lines. The sequencer FPGA 220 and the pattern memory FPGA 230 are also connected to their associated DIMMs 225, 235, and to the bus interface FPGA 210, which interfaces with the system bus 205. The components of the digital instrument 130, shown in FIG. 2, function together, and with other components of the digital instrument 130 that are not illustrated, e.g., a power module, a parametric measurement unit (PMU) and a timing measurement unit (TMU), to generate test signals for the input digital pins of the DUT 190 and to receive and process response signals from the output digital pins of the DUT 190.

The PEFPGAs 237, the timing generation circuits 240, the state tester circuits 245, and the pin electronics circuits 250 are provided in equal numbers and connected in parallel to digital pins of the DUT 190 through the fixture 140. The pin electronics circuits 250 are connected to the digital pins of the DUT 190, and condition the signals that are supplied to the DUT 190 and received from the DUT 190. The pin electronics circuits 250 that are connected to output digital pins of the DUT 190 receive signals from the DUT 190 in their true form, transform them to a threshold digitized format, and supply them to the state tester circuits 245.

Figure 3:
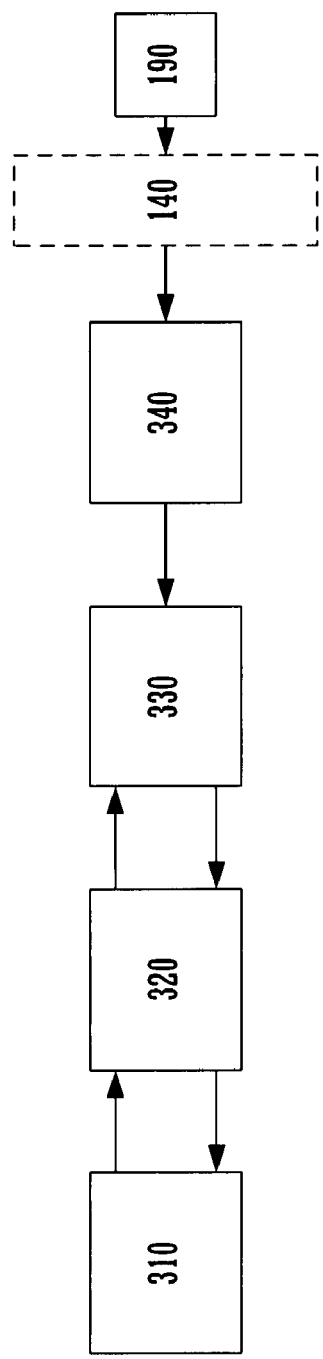
FIG. 3. is a block diagram showing selected components from the instrument shown in FIG. 2.

FIG. 3 is a block diagram of one of the parallel connections of the PEFPGAs 237, the timing generation circuits 240, the state tester circuits 245, and the pin electronics circuits 250. The block diagram of FIG. 3 includes a PEFPGA 310, a timing generation circuit 320, a state tester circuit 330, and a pin electronics circuit 340 that is connected to a digital output pin of the DUT 190 through the fixture 140. The state tester circuit 330 examines the signals that it receives from the pin electronics circuit 340 at strobe times that have been set by the timing generation circuit 320 to determine whether they are '1' or '0' at the strobe times. The strobe times set by the timing generation circuit 320 are referred to as a "strobe event sequence." It is to be understood that one strobe event sequence may define a multiple number of strobe times, and one strobe event sequence is defined per test period. A simple example of a strobe event sequence is shown below:

T0@1*UI,T0@3*UI,T0@5*UI,T0@7*UI

The character string before the symbol '@' instructs the state tester circuit 330 to test for '0', and the character string after the symbol '@' instructs the state tester circuit 330 when to perform the test. The timing of the test is defined as a number of unit intervals (UIs) (one UI=one bit interval) after the beginning of the current test period. Accordingly, the meaning of the above strobe event sequence is as follows:

| Strobe Event | Meaning |
| --- | --- |
| T0@1*UI | Test for '0' one bit interval after the start of the current test period. |
| T0@3*UI | Test for '0' three bit intervals after the start of the current test period. |
| T0@5*UI | Test for '0' five bit intervals after the start of the current test period. |
| T0@7*UI | Test for '0' seven bit intervals after the start of the current test period. |

The timing of the strobe events defined in a strobe event sequence may be shifted in unison by shifting the test period boundary. The timing of the individual strobe events defined in a strobe event sequence may also be adjusted by inserting a '+' or '−' as follows:

T0@1*UI−,T0@3*UI+,T0@5*UI−,T0@7*UI+

The symbol '+' adds a time step to the strobe time and the symbol '−' subtracts a time step from the strobe time. Accordingly, the meaning of the above strobe event sequence is as follows:

| Strobe Event | Meaning |
| --- | --- |
| T0@1*UI− | Test for '0' one bit interval minus a time step after the start of the current test period. |
| T0@3*UI+ | Test for '0' three bit intervals plus a time step after the start of the current test period. |
| T0@5*UI− | Test for '0' five bit intervals minus a time step after the start of the current test period. |
| T0@7*UI+ | Test for '0' seven bit intervals plus a time step after the start of the current test period. |

Figure 4:
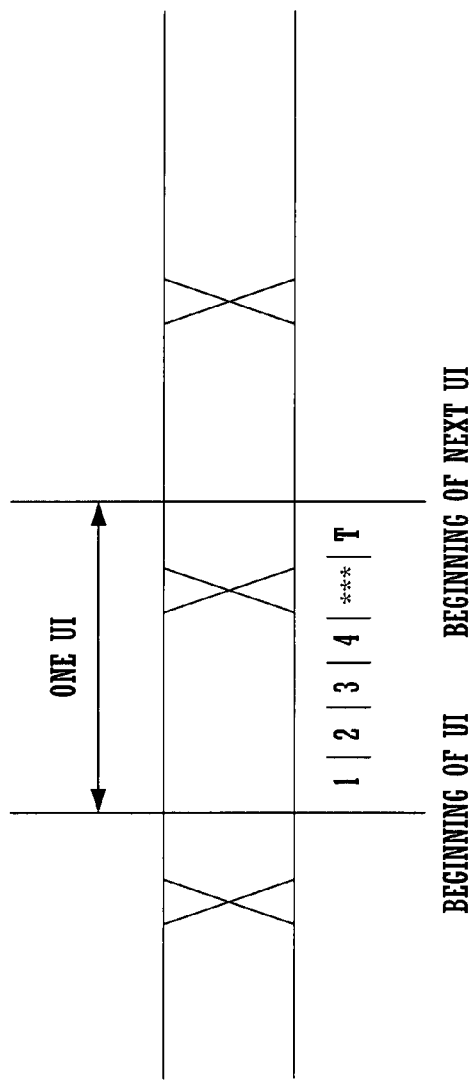
FIG. 4 illustrates a bit interval divided into a number of equal time steps.

In the eye centering method according to an embodiment of the present invention, the same strobe event sequence is used throughout the eye centering process. However, the test period boundary, representing the time at which a test period begins, is shifted a number of times (in equal steps over one UI) and the test period boundary that is estimated to be nearest to the bit center is selected as the test period boundary to be used for strobing during test. The timing of the strobes defined in an event sequence is defined with respect to the test period boundary, and the test period boundary establishes a reference strobe time. The number of times that the test period boundary is shifted to span one UI (hereinafter referred to as 'T') is defined in the test program 150. The time step is also defined using this variable. One time step is defined as UI/T. Therefore, T times steps span one bit interval. Also, when a test period boundary is shifted by T time steps, it returns to its original position. FIG. 4 illustrates the division of one bit interval spanned by the test period boundary (hereinafter referred to as the "spanned interval") into T time steps, and the return of the test period boundary to its original position after it has been shifted by T time steps.

The strobe event sequence used in the eye centering method according to an embodiment of the present invention, referred to herein as an eye centering event sequence, is shown below:

$T0@1*UI-, T0@1*UI+, T0@3*UI-, T0@3*UI+,$
  $T0@5*UI-, T0@5*UI+,$ $T0@7*UI-, T0@7*UI+, T0@10*UI-, T0@10*UI+,$
  $T0@12*UI-, T0@12*UI+,$ $T0@14*UI-, T0@14*UI+, T0@16*UI-, T0@16*UI+$

Figure 5:
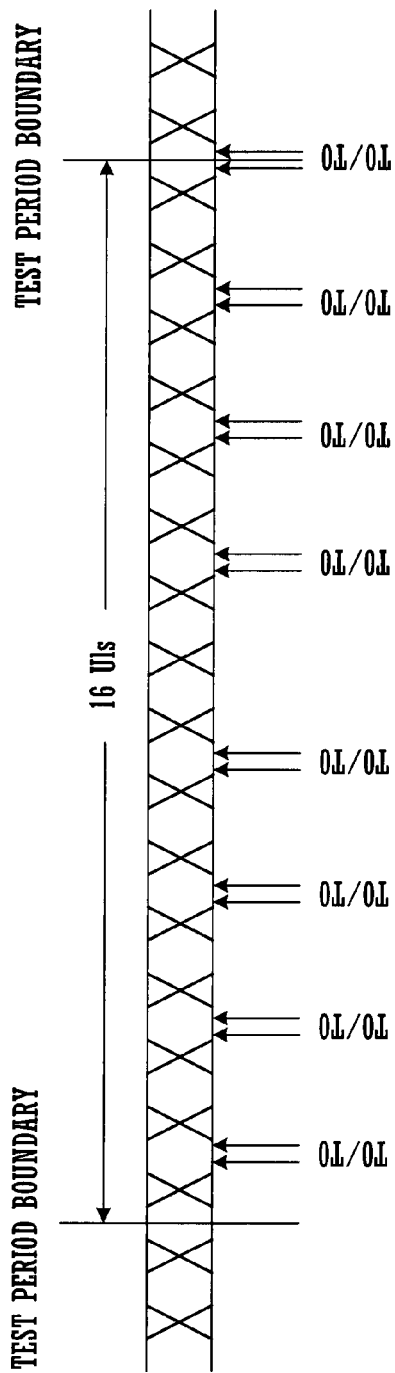
FIG. 5 illustrates a number of different positions for strobe pairs that are used during an eye centering process.

FIG. 5 shows the strobe positions corresponding to the strobe times defined by the above strobe event sequence. As shown, these strobe positions are defined with respect to the test period boundary. Eight pairs of strobe positions are shown in FIG. 5. Each pair has two strobe positions that are separated by two time steps. The PEFPGA 310 compares the strobe readings for each pair and determines that a bit transition has occurred in the interval between the pair if the readings are different. If the PEFPGA 310 determines that a bit transition has occurred, a transition counter associated with the current reference strobe time is incremented. The transition counter is incremented once for each bit transition determined by the PEFPGA 310.

Figure 6:
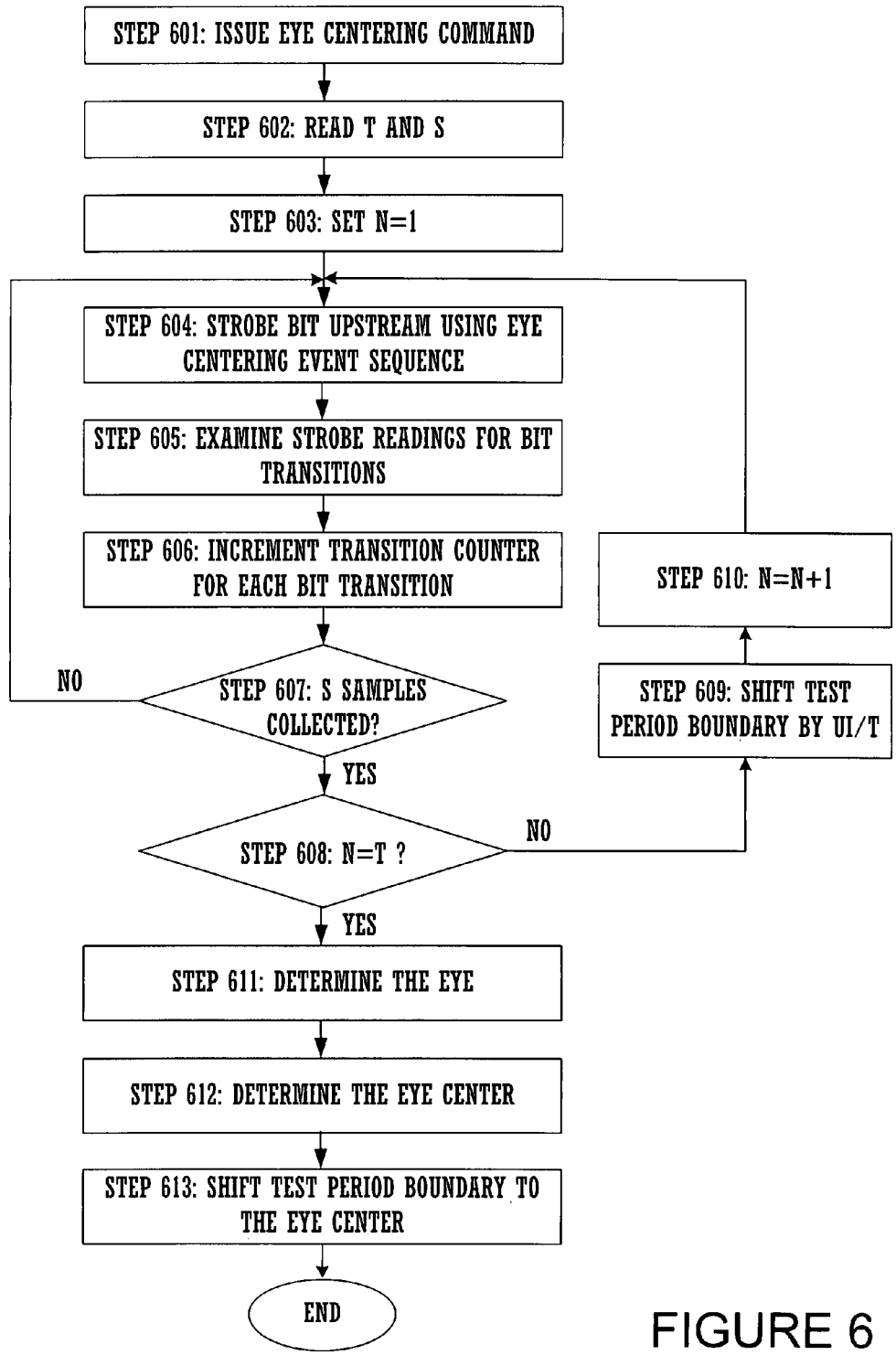
FIG. 6 illustrates an eye centering method according to an embodiment of the invention.

FIG. 6 illustrates the eye centering method according to an embodiment of the present invention. The process begins when an eye centering command is issued by the test system (Step 601). In Step 602, the PEFPGA 310 reads T, the number of times that the test period boundary (reference strobe time) is to be shifted to span one UI, and S, the number of data samples to be collected for each reference strobe position. In the embodiment of the present invention described herein, eight data samples, where each data sample corresponds to one pair of strobe positions, are collected in one test period. In Step 603, the PEFPGA 310 initializes a counter N, corresponding to a reference strobe time, by setting N to be equal to 1.

In Step 604, the bit stream from the DUT is strobed in accordance with the eye centering event sequence. Then, in Step 605, the PEFPGA 310 examines these readings for bit transitions (i.e., whether a strobe pair outputs different readings). For each bit transition detected, the PEFPGA 310 increments a transition counter associated with the reference strobe time (Step 606). In Step 607, the PEFPGA 310 determines whether S data samples have collected for the current reference strobe time. If S data samples have not been collected for each of the reference strobe times, Steps 604-606 are repeated until S data samples have been collected for the current reference strobe time.

If the PEFPGA 310 has collected S data samples for the current reference strobe time, N is compared to T (Step 608). If N is not equal to T, the PEFPGA 310 commands the timing generation circuit 320 to shift the reference strobe time by one time step (UI/T) (Step 609), and also increments N by one (Step 610). The process returns to Step 604 and Steps 604-606 are carried out until S data samples have been collected for the shifted reference strobe time.

If N is equal to T, the PEFPGA 310 identifies all reference strobe times having transition counters equal to 0 as eye candidates, and selects the longest sequence of such eye candidates as the eye (Step 611). During this step, a sequence of eye candidates that is at the end of the spanned interval is considered to continue onto (i.e., wrap around to) the beginning of the spanned interval. As an example, in the case where T=16 and the 1st through 7th reference strobe times and the 13th through 16th reference strobe times are identified as eye candidates, the longest sequence of eye candidates is selected as the following sequence: {13th, 14th, 15th, 16th, 1st, 2nd, 3rd, 4th, 5th, 6th, 7th}.

Then, in Step 612, the PEFPGA 310 determines the reference strobe time that is at the center (if there are an odd number of eye candidates) or adjacent to the center (if there are an even number of eye candidates) of the longest contiguous sequence of eye candidates as corresponding to the eye center (Step 612). In the wrap-around example given above, the 2nd reference strobe time corresponds to the eye center. Referring to the reference strobe time, N, that corresponds to the eye center as N_Center, the PEFPGA 310 shifts the test period boundary by N_Center×(UI/T) ahead of its current position (Step 613), and ends the eye centering process. Thus, if the 2nd reference strobe time corresponds to the eye center, the test period boundary is shifted 2×(UI/T) ahead of its current position.

The eye centering method according to FIG. 6 has been described above with respect to one digital output pin. When there are multiple digital output pins, it is to be understood that the eye centering method according to FIG. 6 is carried out separately for each of the multiple digital output pins using a respective one of the PEFPGAs 237, the timing generation circuits 240, the state tester circuits 245, and the pin electronics circuits 250.

While particular embodiments according to the invention have been illustrated and described above, those skilled in the art understand that the invention can take a variety of forms and embodiments within the scope of the appended claims.

What is claimed is:

1. A method of testing an electronic device, comprising:
   receiving an electronic signal representing a stream of bits from a device under test;
   strobing the bits at two bit positions defined with respect to a number of different reference strobe times to generate at least one pair of strobe readings for each reference strobe time;
   selecting one of the reference strobe times that generate strobe readings that indicate an absence of a bit transition, as a reference strobe time; and
   testing said electronic device utilizing said reference strobe time.

2. The method according to claim 1, wherein the strobe readings indicate an absence of a bit transition if the strobe readings are the same.

3. The method according to claim 1, wherein said strobing and selecting are carried out during initialization phase of testing.

4. The method according to claim 1, wherein T reference strobe times are used and represent a time series, and each reference strobe time is offset from its adjacent reference strobe time by UI divided by T, where UI is the time length of one bit interval.

5. The method according to claim 4, wherein said selecting includes:
   determining the longest contiguous sequence of reference strobe times that generate strobe readings that indicate an absence of a bit transition; and
   selecting a reference strobe time that is at or near the middle of the longest contiguous sequence as the reference strobe time to be used during testing.

6. The method according to claim 1, wherein multiple pairs of strobe readings are generated for each said reference strobe time.

7. The method according to claim 1, wherein said selecting includes:
   identifying reference strobe times that generate strobe readings that are the same each time a pair of strobe readings are generated for said reference strobe times, and selecting one of the identified reference strobe times as a reference strobe time to be used during testing.

8. A method for determining a reference time to be used in strobing bits in a bit stream generated by an electronic device, comprising:
   strobing the bits at two bit positions defined with respect to a first reference time until a predefined number of pairs of strobe readings for said reference time has been strobed;
   shifting the reference time by a fixed increment;
   strobing the bits at two bit positions defined with respect to the shifted reference time until the predefined number of pairs of strobe readings for said shifted reference time has been strobed;
   selecting one of the first reference time or one of the shifted reference times as a reference time to be used in strobing the bits in the bit stream; and
   determining functionality of said electronic device utilizing said reference time to analyze said bit stream.

9. The method according to claim 8, wherein said selecting includes:
   identifying a set of reference time candidates, wherein a reference time is identified as a reference time candidate if each of the pairs of strobe readings for said reference time reference time outputs the same strobe reading; and
   selecting the reference time to be used in strobing the bits in the bit stream from the set of reference time candidates.

10. The method according to claim 9, wherein said selecting further includes:
    determining the longest sequence of reference time candidates; and selecting the reference time candidate that is at or near the center of the longest sequence to be the reference time to be used in strobing the bits in the bit stream.

11. The method according to claim 8, wherein the two bit positions of the first reference time include a first bit position that is strobed one fixed increment prior to the first reference time and a second bit position that is strobed one fixed increment after the first reference time.

12. The method according to claim 8, wherein the two bit positions of the shifted reference time include a first bit position that is strobed one fixed increment prior to the shifted reference time and a second bit position that is strobed one fixed increment after the shifted reference time.

13. An apparatus for testing electronic devices, comprising:
    a drive circuit for generating signals to be supplied to a device under test in accordance with a test program;
    a response circuit for receiving a stream of bits from the device under test and strobing the bits with respect to a reference time to generate strobe readings; and
    a device programmed to generate a number of different reference times to be used in strobing the bits, to collect multiple pairs of strobe readings for each of the different reference times, and to select one of the different reference times that generate strobe readings that indicate an absence of a bit transition as the reference time to be used in subsequent strobing.

14. The apparatus according to claim 13, wherein the different reference times define a sequence of reference times having a common time interval, and the product of the number of different reference times and the common time interval is equal to the time length of one bit interval.

15. The apparatus according to claim 13, wherein the device is programmed to select a reference time to be used in subsequent strobing from a group of reference time candidates, wherein a reference time is identified as a reference time candidate if each of the pairs of strobe readings for said reference time outputs the same strobe reading.

16. The apparatus according to claim 15, wherein the device is programmed to determined the longest sequence of reference time candidates and to select the reference time candidate that is at or near the center of the longest sequence to be the reference time to be used in strobing the bits in the bit stream.

17. The apparatus according to claim 13, wherein the strobe times for each pair of strobe readings are separated from each other by two time increments, wherein one time increment is equal to the time length of one bit interval divided by the number of different reference times.

18. The apparatus according to claim 13, wherein the device is programmed with a strobe sequence applicable for one test period, wherein the bits are strobed during said one test period based on the strobe sequence and one of the different reference times.

19. The apparatus according to claim 18, wherein the strobe sequence is defined relative to the beginning of the test period.

* * * * *